US 6,551,949 B2

(12) United States Patent
Vulpio

(10) Patent No.: US 6,551,949 B2
(45) Date of Patent: Apr. 22, 2003

(54) DEPOSITION METHOD OF DIELECTRIC FILMS HAVING A LOW DIELECTRIC CONSTANT

(75) Inventor: Michele Vulpio, Santo Spirito (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/845,052

(22) Filed: Apr. 27, 2001

(65) Prior Publication Data

US 2002/0004139 A1 Jan. 10, 2002

(30) Foreign Application Priority Data

Apr. 28, 2000 (EP) .............................. 00830319

(51) Int. Cl.⁷ ............................... H01L 21/31
(52) U.S. Cl. ..................... 438/780; 438/791; 438/478
(58) Field of Search ............................... 438/780, 791, 438/478

(56) References Cited

U.S. PATENT DOCUMENTS

| 5,466,850 | A | | 11/1995 | Alty et al. .................. 556/477 |
| 6,303,523 | B2 | * | 10/2001 | Cheung et al. ............. 438/780 |
| 2002/0016084 | A1 | * | 2/2002 | Todd ........................... 438/791 |
| 2002/0018849 | A1 | * | 2/2002 | George et al. ......... 427/255.27 |
| 2002/0019116 | A1 | * | 2/2002 | Sandhu et al. .............. 438/478 |

FOREIGN PATENT DOCUMENTS

EP    0826791    3/1998    ........... C23C/16/40

* cited by examiner

Primary Examiner—John F. Niebling
Assistant Examiner—Olivia T Luk
(74) Attorney, Agent, or Firm—Allen, Dyer, Doppelt Milbrath & Gilchrist, P.A.; Lisa K. Jorgenson

(57) ABSTRACT

A method is for low-dielectric-constant film deposition on a surface of a semiconductor substrate. The deposition may be by chemical vapor deposition (CVD) techniques and may include a wide class of precursor monomeric compounds, namely organosilanes.

10 Claims, No Drawings

DEPOSITION METHOD OF DIELECTRIC FILMS HAVING A LOW DIELECTRIC CONSTANT

FIELD OF THE INVENTION

The present invention relates to the field of electronic devices, such as integrated electronic circuits with very large scale integration (VLSI). More particularly, the invention relates to a method of low dielectric constant film deposition on a semiconductor through chemical vapor deposition (CVD) techniques for use in making such devices.

BACKGROUND OF THE INVENTION

Low dielectric constant films are very important materials for insulation technology used in manufacturing VLSI electronic circuits. Currently, silicon oxide is the dielectric most used in the microelectronics industry. Yet, the trend in this industry is that the devices used in HC-MOS technology are continuously getting smaller. This reduces the average distances between the various devices and, in particular, between the single active elements of the devices.

Accordingly, there is an increasing need for low dielectric constant films which reduce the thickness of the insulation dielectric. Further, it is also desirable to reduce the effects of stray capacitance which results among the various electrically active structures due to the interposed dielectric. Hence, materials that may function as insulation dielectrics and which also have increasingly better gap-fill and step-coverage capacities are sought after.

Numerous references may be consulted for descriptions of current deposition methods. Some examples include: T. Shirafuji et al., "Plasma Copolymerization of Tetrafluoroethylene/Hexamethyldisiloxane, and In Situ Fourier Transform Infrared Spectroscopy of Its Gas Phase," Jpn. J. Appl. Phys., Vol. 38, No. 7B, 1999, pp. 4520–4526; S. M. Yun et al., "Low-Dielectric-Constant-Film Deposition with Various Gases in a Helicon Plasma Reactor," J. Appl. Phys., Vol. 38, No. 7B, 1999, pp. 4531–4534; Y. C. Quan et al., "Polymer-like Organic Thin Film deposited by Plasma Enhanced Chemical Vapor Deposition, Using the Para-xylene Precursor as Low Dielectric Constant Interlayer Dielectrics for Multilevel Metallization," J. Appl. Phys., Vol. 38, No. 3A, 1999, pp. 1356–1358; L. M. Han et al., "Pulsed Plasma Polymerization of Pentafluorostyrene: Synthesis of Low Dielectric Constant Films," J. Of Appl. Phys., Vol. 84, No. 1, 1998, pp. 439–444; S. M. Yun et al., "SiOF Film Deposition Using $FS(OC_2H_5)_3$," J. Of Electrochem. Soc., Vol. 145, No. 7, 1998, pp. 2576–2580; V. Pankov et al., "The Effect of Hydrogen Addition on the Fluorine Doping Level of SiOF Films Prepared by Remote Plasma Enhanced Chemical Vapor Deposition Using $SiF_4$-based Plasmas," Jpn. J. Appl. Phys., Vol. 37, No. 11, 1998, pp. 6135–6141; and Y. Uchida et al., "A Fluorinated Organic-Silica Film with Extremely Low Dielectric Constant," Jpn. J. Appl. Phys., Vol. 38, No. 4B, 1999, pp. 2368–2372).

The prior art deposition methods described in the above references generally relate to the deposition of low dielectric constant films through CVD methods, such as subatmospheric chemical vapor deposition (SACVD), plasma enhanced chemical vapor deposition (PECVD), low pressure chemical vapor deposition (LPCVD), atmospheric, pressure chemical vapor deposition (APCVD), and high density plasma chemical vapor deposition (HDP-CVD). Chemical compounds called precursors are used for starting the film deposition process, which must include chemical elements that will form the chemical structure of the final film.

One typical low dielectric constant film includes fluorocarbons deposited by plasma. Another prior art film is fluorine enhanced silicon oxides (e.g., SiOF) made from mixtures of hexamethyldisiloxane (HMDSO), TFE (tetrafluoroethylene), para-xylene (P-XILENE) and pentafluorostyrene deposited by plasma-chemical methods or by fluoro-triethylsesquioxane (FTES) through CVD or fluoro silicon glass (FSG) methods deposited through HDP-CVD by a mixture of tetrafluofluorosilane and silane. Still other prior art films include the "diamond-like" film provided either by high-temperature processes or with plasma techniques from hydrocarbon mixtures and sesquioxide (HSQ) and methylsesquioxane (MSQ) deposited through a "spin-coating" process.

The above-described methods exhibit certain significant disadvantages. In fact, by using plasma-chemical techniques, it is not possible to control the stoichiometry of the produced film, which among other things exhibits limited "gap fill" and "step coverage." On the contrary, one drawback of SiOF films is the fluorine dissipation during the heating step. With respect to fluorocarbons, one important drawback is the low thermal stability at which these films may decompose after heating. That is, fluorine ions are freed which would irreversibly impair the operation of the device.

Another problem is the throughput of the films that may currently be implemented in plasma-chemical industrial processes. One attempt to address this problem is found in U.S. Pat. No. 4,938,995 to Giordano et al., and assigned to The Standard Oil Company. Films deposited in reasonable process times through "spin-coating" are described in U.S. Pat. No. 5,889,104 to Rosenmayer and assigned to W. L. Gore & Associates, Inc.

Moreover, the above films may have a low dielectric constant and thermal stability above 400° C. Nevertheless, the films deposited through spin-coating can deteriorate as a result of the treatments during the plasma phase to which the device is subjected and during the machining steps subsequent to the deposition. This is because of the properties of such films which behave as insulators and interact with oxygen ($O_2$). Further, the high porosity of these films results in a low dielectric constant and may make them unreliable for use in a process flow for manufacturing microelectronics devices. Moreover, a significant disadvantage of poly-organic films is that they have a low resistance to thermal treatments.

Thus, in the microelectronics industry there is a need for deposition precursor compounds that provide low dielectric constant films which may readily be used for manufacturing VLSI electronic circuits.

SUMMARY OF THE INVENTION

It is an object of the invention to provide a method of low dielectric constant film deposition by using conventional CVD techniques used in the coating processes of thin films with a more advantageous class of precursor compounds (from the thermal stability standpoint), with improved film evenness and process conditions.

The present invention is directed to using a class of monomeric compounds, called organosilanes, as deposition precursors in conventional CVD techniques which are suitable for the industrialization of thin film coating processes. The method of the invention essentially includes using a class of silicon compounds bound to oxygen and to an organic portion as deposition precursors, namely organosilanes.

More specifically, a low dielectric constant film is deposited on a surface of a semiconductor substrate through CVD techniques using a class of precursor monomeric compounds including oxygenated organosilanes. The precursor monomers may include at least one silicon-oxygen-organic unit bond. The organic unit preferably is a non-substituted benzene ring or has at least one substituent selected from the group including a $C_{1-4}$ alkyl, halogen, $CF_3$ or other aromatic compounds. Advantageously, according to the invention, the monomeric compounds may have the following formula:

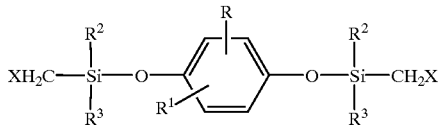

where R and $R^1$ are each equal to H, Hal, a $C_{1-4}$ alkyl, $CF_3$, a $C_{1-4}$ alkoxide, $NO_2$, or an aromatic ring (optionally substituted), $R^2$ and $R^3$ each are a $C_{1-4}$ alkyl, and X is a halogen (e.g., Br or Cl).

DETAILED DESCRIPTION OF THE PREFERRED EMBODIMENTS

The features and the advantages of the method and device according to the invention will become more apparent from the following description of an embodiment thereof, given by way of non-limitative example. The process steps and the structures described herein do not form a complete process flow for manufacturing integrated circuits. In fact, the present invention can be implemented together with the manufacturing techniques of integrated circuits currently used in the field, as will be appreciated by those of skill in the art. Only those process steps that are commonly used and are necessary for understanding the invention are hereafter described.

The method of the invention allows a low dielectric constant film deposition step to be performed using monomers including the Si—O—Ar—O group, i.e., including a silicon-oxygen bond bound to an aromatic ring. For example, one of the compounds includes 1,4-bis-[chloromethyl]dimethyl-silil-oxybenzene. A significant feature of these compounds is the silicon-oxygen-benzene bond. In fact, as will be appreciated by those of skill in the art, the Si-O bond exhibits the feature of thermally stabilizing the deposited film. Further, the organic unit allows a low dielectric constant film, made of a basic unit, to be obtained.

The basic unit is repeated in the three space directions which form the entire film stack, and organic compounds based on C, H, O are present. Moreover, the fact that the organic unit includes a benzene ring also allows films with a high thermal and chemical stability to be obtained. Additionally, the benzene ring cab have one or more substituents. In particular, by substituting the benzene ring with halogens, such as fluorine and chlorine, it is possible to obtain a further reduction of the dielectric constant.

It is important to point out that these compounds may be produced at a high purity (99%). Their chemical and physical features are suitable for use as precursors in the CVD techniques. In particular, the boiling point of the compound of the invention may be, for example, about 118° C. That is, it may be lower than that of tetraethylorthosilicate (TEOS), which is the liquid currently used for silicon-oxide film deposition. This particular feature allows a process flow during which the monomer is stable. A possible process flow is that wherein SACVD is used as a CVD sample technique for dielectric deposition. Hereafter, the typical SACVD process, activated by ozone, is shown in the case where 1,4-bis-[chloromethyl]dimethyl-silyl-oxybenzene is used:

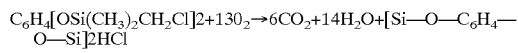

The films provided according to the invention exhibit numerous important features of low dielectric constant films. Namely, they have a dielectric constant lower than that of silicon oxide (which is equal to 3.9). Further, their thermal stability is above 400° C. when used as pre-metal dielectric (PMD) and inter metal dielectric (IMD) layers. Also, better gap fill and step coverage which are suitable to the advanced technologies. (<0.18 m) are obtained, and chemical inertia during the other processes to which the devices are subjected may be realized. In fact, the low dielectric constant is substantially guaranteed by the organic portion contained in the film. The high thermal stability is due to the Si-O bond and to the organic unit, which is characteristic of organosilanes. Moreover, the organic unit reduces the chemical reactivity of the film.

Thus, the films of the invention exhibit good electric and chemical-physical properties. Moreover, by using the same deposition precursor and by changing the CVD technique (SACVD, LPCVD, APCVD, PECVD), it is possible to obtain different types of films. These may differ, for example, in chemical-physical parameters, density, chemical composition, dielectric constant, film stress, and resistance to temperature. Also, the films deposited using the precursor class disclosed herein can be advantageously used as PMD and IMD, and therefore may easily be used on an industry scale.

That which is claimed is:

1. A method for making a semiconductor device comprising:
    depositing a dielectric film having a low dielectric constant on a semiconductor substrate by chemical vapor deposition (CVD) using a monomeric precursor compound comprising oxygenated organosilanes, the oxygenated organosilanes having at least one silicon-oxygen-benzene ring bond.

2. The method according to claim 1 wherein the benzene ring comprises at least one substituent selected from the group consisting of a $C_{1-4}$ alkyl, halogen, $CF_3$, H, and an aromatic ring.

3. The method according to claim 1 wherein the monomeric precursor compound has the following formula:

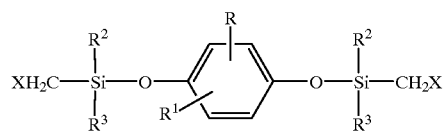

where R and $R^1$ are each selected from the group consisting of H, Hal, a $C_{1-4}$ alkyl, $CF_3$, a $C_{1-4}$ alkoxide, $NO_2$, and an aromatic ring; $R^2$ and $R^3$ are each a $C_{1-4}$ alkyl; and X is a halogen.

4. The method according to claim 3 wherein the halogen is Cl or Br.

5. The method according to claim 3 wherein R and $R^1$ are H, $R^2$ and $R^3$ are $CH_3$, and X is Cl.

6. A method for making a semiconductor device comprising:
    depositing a dielectric film having a low dielectric constant on a semiconductor substrate using a monomeric precursor compound comprising oxygenated organosilanes, the oxygenated organosilanes having at least one silicon-oxygen-benzene ring bond.

7. The method according to claim 1 wherein the benzene ring comprises at least one substituent selected from the group comprising a $C_{1-4}$ alkyl, halogen, $CF_3$, H, and an aromatic ring.

8. The method according to claim 1 wherein the monomeric precursor compound has the following formula:

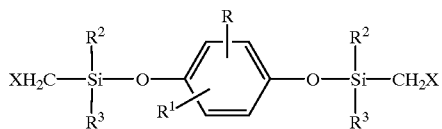

where R and $R^1$ are each selected from the group comprising H, Hal, a $C_{1-4}$ alkyl, $CF_3$, a $C_{1-4}$ alkoxide, $NO_2$, and an aromatic ring; $R^2$ and $R^3$ are each a $C_{1-4}$ alkyl; and X is a halogen.

9. The method according to claim 8 wherein the halogen is Cl or Br.

10. The method according to claim 8 wherein R and $R^1$ are H, $R^2$ and $R^3$ are $CH_3$, and X is Cl.

* * * * *

UNITED STATES PATENT AND TRADEMARK OFFICE
CERTIFICATE OF CORRECTION

PATENT NO.     : 6,551,949 B2
DATED          : April 22, 2003
INVENTOR(S)    : Michele Vulpio It is certified that error appears in the above-identified patent and that said Letters Patent is hereby corrected as shown below:

Column 3,
Line 51, delete "cab" insert -- can --

Column 4,
Line 64, delete "claim 1" insert -- claim 6 --

Column 5,
Line 1, delete "claim 1" insert -- claim 6 --

Signed and Sealed this

Second Day of March, 2004

JON W. DUDAS
*Acting Director of the United States Patent and Trademark Office*